(12) United States Patent
Taneichi et al.

(10) Patent No.: US 8,945,799 B2
(45) Date of Patent: Feb. 3, 2015

(54) PELLICLE AND MASK ADHESIVE AGENT FOR USE IN SAME

(75) Inventors: Daiki Taneichi, Chiba (JP); Takashi Kozeki, Otake (JP); Akihiro Koide, Mobara (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 266 days.

(21) Appl. No.: 13/805,460

(22) PCT Filed: Jun. 29, 2011

(86) PCT No.: PCT/JP2011/003706
§ 371 (c)(1),
(2), (4) Date: Dec. 19, 2012

(87) PCT Pub. No.: WO2012/004951
PCT Pub. Date: Jan. 12, 2012

(65) Prior Publication Data
US 2013/0101927 A1    Apr. 25, 2013

(30) Foreign Application Priority Data
Jul. 9, 2010    (JP) ................. 2010-156864

(51) Int. Cl.
*G03F 1/00* (2012.01)
*G03F 1/62* (2012.01)
(Continued)

(52) U.S. Cl.
CPC .. *G03F 1/62* (2013.01); *G03F 1/64* (2013.01); *C09J 135/06* (2013.01); *C08L 23/20* (2013.01); *C09J 153/025* (2013.01)
USPC .............................................................. 430/5

(58) Field of Classification Search
CPC ...................................... G03F 1/62; G03F 1/64
USPC .............................................................. 430/5
See application file for complete search history.

(56) References Cited

U.S. PATENT DOCUMENTS 3,917,607 A     11/1975  Crossland et al.
5,085,899 A  *  2/1992   Nakagawa et al. ............. 428/14
(Continued)

FOREIGN PATENT DOCUMENTS

EP    0 893 736 A1    1/1999
JP    4-237056 A      8/1992
(Continued)

OTHER PUBLICATIONS

Extended European Search Report issued Jan. 8, 2014, by the European Patent Office in corresponding European Patent Application No. 11803292.9. (8 pages).

(Continued)

*Primary Examiner* — Stewart Fraser
(74) *Attorney, Agent, or Firm* — Buchanan, Ingersoll & Rooney PC

(57) ABSTRACT

A pellicle which has a mask adhesive layer that can be plastic-deformed readily particularly at a temperature at which exposure to light is carried out, rarely provides a residue of an adhesive agent upon the removal of the mask adhesive layer from a mask and has good handling properties, and which can prevent the position gap of a pattern. The pellicle comprises a pellicle frame, a pellicle membrane and a mask adhesive layer containing a mask adhesive agent. The mask adhesive agent comprises 100 parts by mass of a thermoplastic elastomer (A) having a tan δ peak temperature of −20 to 30 DEG C and 20 to 150 parts by mass of an adhesiveness-imparting resin (B).

9 Claims, 1 Drawing Sheet

(51) Int. Cl.
*G03F 1/64* (2012.01)
*C09J 135/06* (2006.01)
*C08L 23/20* (2006.01)
*C09J 153/02* (2006.01)

(56) References Cited

U.S. PATENT DOCUMENTS

| | | | |
|---|---|---|---|
| 5,683,798 | A | 11/1997 | Bennett et al. |
| 5,729,325 | A * | 3/1998 | Kashida .................... 355/30 |
| 2003/0096178 | A1 | 5/2003 | Fujita et al. |
| 2006/0257754 | A1 | 11/2006 | Harubayashi et al. |
| 2008/0063952 | A1 | 3/2008 | Shirasaki |
| 2008/0090418 | A1 | 4/2008 | Jeon et al. |
| 2010/0028671 | A1 | 2/2010 | Mitsui et al. |
| 2010/0239800 | A1 | 9/2010 | Ikeda et al. |
| 2011/0269294 | A1 | 11/2011 | Koh et al. |
| 2012/0202144 | A1 * | 8/2012 | Murakami et al. ............ 430/5 |

FOREIGN PATENT DOCUMENTS

| | | |
|---|---|---|
| JP | 8-151557 A | 6/1996 |
| JP | 10-282640 A | 10/1998 |
| JP | 11-323072 A | 11/1999 |
| JP | 2000-267261 A | 9/2000 |
| JP | 2003-202660 A | 7/2003 |
| JP | 2007-156397 A | 6/2007 |
| JP | 2008-065258 A | 3/2008 |
| JP | 2008-103718 A | 5/2008 |
| JP | 2008-103719 A | 5/2008 |
| JP | 2008-159701 A | 7/2008 |
| JP | 2008-174727 A | 7/2008 |
| JP | 2009-012464 A | 1/2009 |
| KR | 2000-0064877 A | 11/2000 |
| WO | WO 98/35270 A1 | 8/1998 |
| WO | WO 2010/116848 A1 | 10/2010 |

OTHER PUBLICATIONS

International Search Report (PCT/ISA/210) issued on Aug. 30, 2011, by the Japanese Patent Office as the International Searching Authority for International Application No. PCT/JP2011/003706.

* cited by examiner

PELLICLE AND MASK ADHESIVE AGENT
FOR USE IN SAME

TECHNICAL FIELD

The present invention relates to a pellicle that is mounted on a mask during exposure, and a mask adhesive used therein.

BACKGROUND ART

In a process for manufacturing a semiconductor device such as an LSI or a VLSI, a liquid crystal display panel, and/or the like, patterning is performed by exposing light onto a photosensitive layer or the like via a mask (also referred to as an exposure negative or a reticle). When there are foreign particles attached to the mask upon patterning, the light is absorbed or bent by the foreign particles. As a result, the formed pattern is deformed, the edges are rough, and there is a loss in the dimensions, the quality, and the appearance of the patterning, and the like. In order to solve such a problem, a pellicle is used which is a dustproof cover including a pellicle membrane that allows light to pass through onto a surface of a mask, in order to prevent the attachment of foreign particles to the surface of the mask.

A pellicle generally includes a metal pellicle frame and a pellicle membrane disposed on one end surface of the pellicle frame. A mask adhesive layer for fixing the pellicle to a mask is formed on the other end surface of the pellicle frame. A sheet-shaped material (separator) that has releasability in order to protect the mask adhesive layer is normally disposed on the surface of the mask adhesive layer.

For mounting the pellicle on the mask, the separator is peeled so as to expose a mask adhesive layer, and the pellicle is pressure-bonded and fixed at a predetermined position of the mask via the exposed mask adhesive layer. By mounting the pellicle on the mask in this manner, the mask can be irradiated with light while the influence of foreign particles is eliminated.

As an adhesive used for a pellicle adhering to a mask, an adhesive is proposed that contains a hydrogenation product of a block copolymer having a saturated cyclic hydrocarbon structure, such as a styrene/isoprene/styrene triblock copolymer, and a tackifier (see, e.g., Patent Literature 1). In addition, a hot melt adhesive containing a styrene/ethylene/propylene/styrene triblock copolymer and an aliphatic petroleum resin is proposed (see, e.g., Patent Literature 2). A pressure-sensitive adhesive containing two types of block copolymers having a polymer block composed of an alkyl (meth)acrylate ester, and a tackifying resin, such as a (hydrogenated) petroleum resin, is also proposed (see, e.g., Patent Literature 3).

In order to highly integrate semiconductor devices, it is necessary to make a formed pattern finer. In other words, in order to integrate many semiconductor devices in a narrow area, it is necessary to decrease the size of semiconductor devices as much as possible. Therefore, it is necessary to decrease the width of a circuit pattern, and the spacing (pitch) between adjacent circuit patterns. However, there is a resolution limit to a pattern forming method using photolithography, and therefore, there is a limit to making a pattern finer.

As a method for overcoming such a resolution limit in the photolithography process, double patterning is known. Double patterning is a technique where one circuit pattern is split into two parts, and exposure is performed for each split pattern to ultimately obtain a high-density fine pattern (see, e.g., Patent Literatures 4 and 5). Double patterning is preferably applied to the manufacture of semiconductors of 22 nm node (half pitch: 32 nm) and beyond.

In double patterning, exposure is normally performed twice using two masks. Therefore, it is important for double patterning to increase a precision of the relative positions of two formed patterns. In other words, when the precision of the relative positions of a pattern obtained by the first exposure and a pattern obtained by the second exposure is low, the desired pattern cannot be obtained. Therefore, it is necessary to decrease an amount of the pattern displacement between the formed circuit pattern with the two masks and a designed circuit pattern to the nanometer (nm) level.

CITATION LIST

Patent Literature

PTL 1: Japanese Patent Application Laid-Open No. 2000-267261.
PTL 2: Japanese Patent Application Laid-Open No. 4-237056.
PTL 3: Japanese Patent Application Laid-Open No. 11-323072.
PTL 4: Japanese Patent Application Laid-Open No. 2008-103718.
PTL 5: Japanese Patent Application Laid-Open No. 2008-103719.

SUMMARY OF INVENTION

Technical Problem

A distortion in the mask can cause the pattern displacement of the formed circuit pattern with the two masks. It is thought that a distortion in the mask is caused by a distortion of a pellicle frame transferring to the mask through the mask adhesive layer when a pellicle is pressure-bonded to the mask. Therefore, it is effective to form a mask adhesive layer with a material (mask adhesive) that is effectively plastic-deformed so that the strain energy of the pellicle frame is relaxed with the mask adhesive layer.

An example of a parameter that indicates the ease of plastic deformation of a mask adhesive can include a loss tangent (hereinafter also referred to as "tan δ"). For example, a mask adhesive having a temperature at which the tan δ is a maximum value (hereinafter also referred to as the "tan δ peak temperature"), in the range of −10° C. to 30° C. is easily plastic-deformed at a temperature at which exposure is performed in double patterning (generally room temperature). The mask adhesive layer is plastic-deformed, and thus the strain energy of the pellicle frame can be effectively relaxed.

A general mask adhesive contains a base polymer, which is the main component, and other various additives. A tackifying resin as one additive has the function of shifting the tan δ peak temperature of the base polymer as the main component to higher temperatures. Therefore, the amount of the tackifying resin added is adjusted in order to set the tan δ peak temperature of the mask adhesive in the desired temperature range.

However, a general thermoplastic elastomer used as the base polymer such as a styrene/ethylene/butylene/styrene block copolymer (SEBS) has the tan δ peak temperature of about −70° C. to −50° C., which is low. Therefore, in order to set the tan δ peak temperature of the mask adhesive around room temperature, it is necessary to add a large amount of the tackifying resin. However, a mask adhesive containing a high amount of a tackifying resin may be too soft. When an excessively soft mask adhesive is used, a paste residue is easily left on the mask surface when the pellicle is peeled from the mask after exposure. Further, the excessively soft mask adhesive has high instantaneous adhesiveness. And therefore, another problem is generated that the mask adhesive is too sticky to hand contacting therewith, and handling thereof is poor.

The present invention has been made in view of such problems in the conventional art. The present invention aims to provide a pellicle having a mask adhesive layer that is easily plastic-deformed particularly in a temperature range in which exposure is performed. And also, almost no paste residue of the mask adhesive layer is left on a mask when the pellicle is peeled from the mask, which causes good handling properties. Moreover, the present invention aims to provide a pellicle that can reduce a pattern displacement. In addition, the present invention aims to provide a mask adhesive used in such a pellicle.

Solution to Problem

Specifically, the present invention provides pellicles and mask adhesives shown below.

[1] A pellicle including a pellicle frame, a pellicle membrane disposed on one end surface of the pellicle frame, and a mask adhesive layer including a mask adhesive, disposed on the other end surface of the pellicle frame, in which the mask adhesive includes 100 parts by mass of a thermoplastic elastomer (A) having a temperature of −20° C. to 30° C. at which the maximum value of loss tangent is measured under a frequency of 1 Hz, and 20 to 150 parts by mass of a tackifying resin (B), the thermoplastic elastomer (A) is at least one selected from the group consisting of styrene thermoplastic elastomers, (meth)acrylate ester thermoplastic elastomers, and olefin thermoplastic elastomers, and the mask adhesive has a temperature of −10° C. to 30° C. at which the maximum value of loss tangent is measured under a frequency of 1 Hz.

[2] The pellicle according to [1], wherein the thermoplastic elastomer (A) is a styrene thermoplastic elastomer.

[3] The pellicle according to [2], wherein the styrene thermoplastic elastomer is a triblock copolymer including a first polystyrene block, a polyisoprene block having an isopropenyl group in a side chain and a second polystyrene block, and/or a hydrogenation product of the triblock copolymer.

[4] The pellicle according to any of [1] to [3], wherein a softening point of the tackifying resin (B) as measured by a ring-and-ball method prescribed in JIS K-2207 is 60° C. to 150° C.

[5] The pellicle according to any of [1] to [4], wherein a number average molecular weight of the tackifying resin (B) is 300 to 3,000.

[6] The pellicle according to any of [1] to [5], wherein the tackifying resin (B) is at least one selected from the group consisting of a rosin and a derivative thereof, a polyterpene resin and a hydrides thereof, terpene phenol resin and a hydrides thereof, an aromatic modified terpene resin and a hydrides thereof, a coumarone-indene resin, an aliphatic petroleum resin, an alicyclic petroleum resin and a hydride thereof, an aromatic petroleum resin and a hydrides thereof, aliphatic-aromatic copolymer petroleum resin, a dicyclopentadiene petroleum resin and a hydrides thereof, a low molecular weight polymer of styrene, and a low molecular weight polymer of a substituted styrene.

[7] A pellicle including:
a pellicle frame;
a pellicle membrane disposed on one end surface of the pellicle frame; and
a mask adhesive layer including a mask adhesive, the mask adhesive layer being disposed on the other end surface of the pellicle frame, wherein a peel strength of the mask adhesive from a quartz glass substrate is 50 to 300 gf at 23° C., and a stress remaining rate R(900) of the mask adhesive defined by the following formula (1) is in the range of 0≤R(900)≤15%, $$\text{stress remaining rate } R(900)=\{F(900)/F(0)\}\times 100 \quad (1)$$

where F(0) represents maximum stress measured by stress relaxation measurement, F(900) represents stress measured by the stress relaxation measurement after 900 seconds in test time have lapsed; and the stress relaxation measurement is executed under a condition of 23° C. with a rheometer.

[8] A mask adhesive including 100 parts by mass of a thermoplastic elastomer (A) having a temperature of −20° C. to 30° C. at which the maximum loss tangent is measured under a frequency of 1 Hz, and 20 to 150 parts by mass of a tackifying resin (B), wherein
the thermoplastic elastomer (A) is at least one selected from the group consisting of a styrene thermoplastic elastomer, a (meth)acrylate ester thermoplastic elastomer, and an olefin thermoplastic elastomer, the mask adhesive having a temperature of −10° C. to 30° C. at which the maximum value of a loss tangent is measured under a frequency of 1 Hz.

[9] A mask adhesive having a peel strength from a quartz glass substrate of 50 to 300 gf at 23° C., and a stress remaining rate R(900), defined by the following formula (1), in the range of 0≤R(900)≤15%, $$\text{stress remaining rate } R(900)=\{F(900)/F(0)\}\times 100 \quad (1)$$

where F(0) represents maximum stress measured by stress relaxation measurement, F(900) represents stress measured by the stress relaxation measurement after 900 seconds in test time have lapsed, measured by the stress relaxation measurement; and the stress relaxation measurement is executed under a condition of 23° C. with a rheometer.

Advantageous Effects of Invention

The pellicle of the present invention includes a mask adhesive layer that is easily plastic-deformed, particularly in a temperature range in which exposure is performed. And also, almost no paste residue of the mask adhesive layer is left on a mask when the pellicle is peeled from the mask. Therefore, when the pellicle of the present invention is used, pattern displacement can be reduced. In addition, this mask adhesive layer is not too sticky, and therefore also has good handling properties. Accordingly, the pellicle of the present invention is preferred for patterning in which high patterning precision is required, including double patterning.

In addition, the mask adhesive of the present invention can provide a mask adhesive layer that is easily plastic-deformed, particularly in a temperature range in which exposure is performed. And also almost no paste residue of the mask adhesive layer is left on the mask when the pellicle is peeled from the mask, the mask adhesive having good handling properties. Therefore, when the mask adhesive of the present invention is used, a pellicle can be provided that is desirable for patterning requiring high patterning precision, which includes double patterning.

DESCRIPTION OF EMBODIMENTS

1. Mask Adhesive

Figure 1:
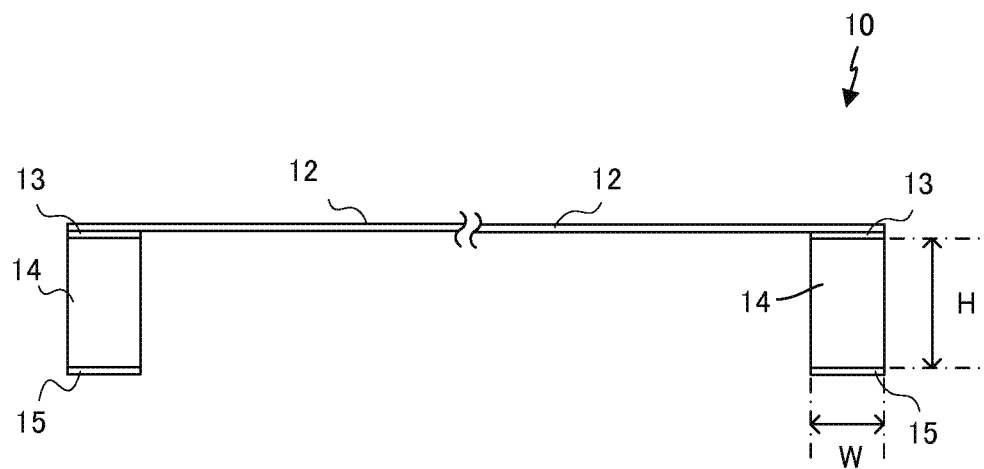
FIG. 1 is a schematic view showing one embodiment of the pellicle of the present invention.

The mask adhesive of the present invention includes a particular thermoplastic elastomer (A) and a particular tackifying resin (B), and further includes other components, such as a softener and a wax, as required.

(Thermoplastic Elastomer (A))

The tan δ peak temperature of the thermoplastic elastomer (A) is −20° C. to 30° C., preferably −20° C. to 25° C., further preferably −20° C. to 20° C., and more preferably −20° C. to 0° C. When the thermoplastic elastomer (A) having a tan δ peak temperature in the above range is used as a base polymer, the tan δ peak temperature of the obtained mask adhesive can be set in the range of −10° C. to 30° C. even if the amount of the tackifying resin (B) blended is decreased. Therefore, a mask adhesive can be provided that is easily plastic-deformed in an exposure temperature range and that has reduced stickiness.

The tan δ (loss tangent) is represented by the value of the ratio (G"/G') of loss modulus (G") to storage modulus (G'). When the maximum value of tan δ of a material is large, the material is easily plastic-deformed. The maximum value of the tan δ of the thermoplastic elastomer (A) is preferably in the range of 0.5 to 3, and further preferably in the range of 0.9 to 2.0.

The tan δ (loss tangent) can be measured and calculated using a dynamic viscoelasticity measuring apparatus (trade name "ARES," manufactured by TA Instruments). Specifically, a disk-shaped sample piece (diameter: 25 mm×thickness: 2 mm) is sandwiched between two parallel plates (diameter: 25 mm) which are measurement jigs to obtain a test piece. The thickness of the test piece is adjusted to a predetermined initial gap width, and then the storage modulus (G') and the loss modulus (G") are measured under the conditions of a nitrogen atmosphere, a shear mode, frequency of 1 Hz, measurement temperature of −80° C. to 200° C., temperature increase rate of 3° C./min, and initial Gap of 2 mm. Then, the tan δ (=G"/G') can be calculated from the obtained storage modulus (G') and loss modulus (G").

Examples of the thermoplastic elastomer (A) include (i) styrene thermoplastic elastomers, (ii) (meth)acrylate ester thermoplastic elastomers, and (iii) olefin thermoplastic elastomers. A single thermoplastic elastomer (A) may be used alone, or two or more may be used in combination.

Among these elastomers, (i) the styrene thermoplastic elastomers demonstrate excellent hydrolysis resistance due to a lack of ester bond moities within the molecular skeleton thereof. And also (i) the styrene thermoplastic elastomers demonstrate both excellent flexibility and mechanical strength due to the presence of both a soft segment and a hard segment within the molecular skeleton thereof. Therefore, (i) the styrene thermoplastic elastomer is desirable.

((i) Styrene Thermoplastic Elastomer)

The styrene thermoplastic elastomer is a polymer including a constituent unit derived from styrene, and is preferably a block copolymer of styrene and an olefin other than styrene. As the olefin other than styrene, monomers that can form a side chain having a bulky branched structure in a polymer block, such as isoprene and 4-methyl-1-pentene, are preferred. Among them, isoprene is particularly preferred.

The proportion of the total constituent units derived from styrene with respect to the styrene thermoplastic elastomer is preferably 35 mass % or less, or more preferably 20 mass % or less. If the amount of the constituent unit derived from styrene is too high, the compatibility with various additives decreases, and the styrene thermoplastic elastomer and the additives may be separated.

As the styrene thermoplastic elastomer, a triblock copolymer having a first polystyrene block, a polyisoprene block having an isopropenyl group (1-methylethenyl group (—C(=CH$_2$)CH$_3$)) in the side chain, and a second polystyrene block (hereinafter also referred to as "SIS"), or a hydrogenation product of the above triblock copolymer (hereinafter also referred to as "H-SIS") is preferred. The tan δ peak temperature of a triblock copolymer including a polymer block having a bulky branched structure (such as isopropenyl group) in the side chain is generally about −20° C. to 30° C., which is high. "A hydrogenation product of a triblock copolymer" means a triblock copolymer in which preferably 90% or more, further preferably 95% or more, of unsaturated bonds in the "polyisoprene block" included in the SIS are hydrogenated.

Specific examples of the above SIS can include commercial products such as the trade name "HYBRAR 5127" (manufactured by KURARAY CO., LTD., tan δ peak temperature: 20° C.) and the trade name "HYBRAR 5215" (manufactured by KURARAY CO., LTD., tan δ peak temperature: −3° C.).

In addition, specific examples of the above H-SIS can include commercial products such as the trade name "HYBRAR 7125" (manufactured by KURARAY CO., LTD., tan δ peak temperature: −5° C.) and the trade name "HYBRAR 7311" (manufactured by KURARAY CO., LTD., tan δ peak temperature: −17° C.).

((ii) (Meth)Acrylate Ester Thermoplastic Elastomer)

The (meth)acrylate ester thermoplastic elastomer is a polymer including a constituent unit derived from a (meth)acrylate ester. The (meth)acrylate ester thermoplastic elastomer is more specifically a diblock or triblock copolymer including a block of methyl (meth)acrylate and a block of (meth)acrylate ester other than the polymethyl (meth)acrylate. As the (meth)acrylate ester other than the polymethyl (meth)acrylate, monomers that can form a side chain having a bulky branched structure in a polymer block is preferred, such as poly(n-butyl (meth)acrylate), poly(2-ethylhexyl (meth)acrylate), and poly(isononyl (meth)acrylate). Among the (meth)acrylate ester thermoplastic elastomers, poly(n-butyl (meth)acrylate) is preferred.

Specific examples of the (meth)acrylate ester thermoplastic elastomer can include the trade name "LA polymer" series (manufactured by KURARAY CO., LTD.).

((iii) Olefin Thermoplastic Elastomer)

It is preferable that the olefin thermoplastic elastomer is a copolymer of one or two or more α-olefins, and is amorphous or low crystalline. Examples of α-olefins can include ethylene, propylene, butene, pentene, hexene, heptene, octene, nonene, decene, undecene, dodecene, and 4-methylpentene-1.

Specific examples of the olefin thermoplastic elastomer can include commercial products such as the trade name "TAFMER" (manufactured by Mitsui Chemicals, Inc.) and the trade name "NOTIO" (manufactured by Mitsui Chemicals, Inc.).

(Tackifying Resin (B))

The tackifying resin (B) is a component that has the function of shifting the tan δ peak temperature of the thermoplastic elastomer (A) as a base polymer to higher temperature. The softening point of the tackifying resin (B) is preferably 60° C. to 150° C., further preferably 90° C. to 120° C., and more preferably 90° C. to 110° C.

If the softening point of the tackifying resin (B) is less than 60° C., the tackifying resin (B) may bleed out of the mask adhesive. In addition, the ability of shifting the tan δ peak temperature of the thermoplastic elastomer (A) as a base polymer to higher temperature may be insufficient. On the other hand, if the softening point of the tackifying resin (B) is more than 150° C., the function of providing pressure-sensitive adhesiveness to the thermoplastic elastomer (A) as a base polymer may be lost. The softening point of the tackifying resin (B) is measured by the ring-and-ball method prescribed in JIS K-2207.

In addition, the number average molecular weight (Mn) of the tackifying resin (B) is preferably 300 to 3,000, further preferably 500 to 1000.

If the number average molecular weight (Mn) of the tackifying resin (B) is less than 300, the softening point tends to be too low. On the other hand, if the number average molecular weight (Mn) of the tackifying resin (B) is more than 3,000, the softening point tends to be too high. The number average molecular weight (Mn) of the tackifying resin (B) is measured by gel permeation chromatography (GPC) using polystyrene as a standard.

The tackifying resin (B) preferably has compatibility with the thermoplastic elastomer (A). Thus, the tan δ peak temperature of the thermoplastic elastomer (A) can be effectively shifted to higher temperature. In terms of compatibility with the thermoplastic elastomer (A), examples of the tackifying resin (B) can include rosins and derivatives thereof, polyterpene resins and hydrides thereof, terpene phenol resins and hydrides thereof, aromatic modified terpene resins and hydrides thereof, coumarone-indene resins, aliphatic petroleum resins, alicyclic petroleum resins and hydrides thereof, aromatic petroleum resins and hydrides thereof, aliphatic-aromatic copolymer petroleum resins, and dicyclopentadiene petroleum resins and hydrides thereof. These are preferred because they have high compatibility with the polyisoprene block of SIS or H-SIS.

Among the tackifying resins (B), the rosin and the derivatives thereof, the polyterpene resins and the hydrides thereof, the aliphatic petroleum resins, and the alicyclic petroleum resins and the hydrides thereof are preferred; and the rosins and the derivatives thereof, the aliphatic petroleum resins, and the alicyclic petroleum resins and the hydrides thereof are more preferred. When the thermoplastic elastomer (A) is (i) the styrene thermoplastic elastomer, the hydride of the alicyclic petroleum resin is particularly preferred.

Specific examples of the rosins and the derivatives thereof can include the trade names "PINECRYSTAL," "SUPER ESTER," and "TAMANOL" (manufactured by Arakawa Chemical Industries, Ltd.). Specific examples of the polyterpene resin, the terpene phenol resin, the aromatic modified terpene resin, and the hydride thereof can include the trade names "YS Resin," "YS Polyster," and "Clearon" (manufactured by YASUHARA CHEMICAL Co., Ltd.). Specific examples of the aliphatic petroleum resin, the alicyclic petroleum resin and the hydride thereof, the aromatic petroleum resin and the hydride thereof, the aliphatic-aromatic copolymer petroleum resin, and the dicyclopentadiene petroleum resin and the hydride thereof can include the trade names "ARKON" (manufactured by Arakawa Chemical Industries, Ltd.), "Hi-rez" (manufactured by Mitsui Chemicals, Inc.), "I-MARV" (manufactured by Idemitsu Kosan Co., Ltd.), "QUINTONE" (manufactured by ZEON Corporation), and "Escorez" (manufactured by Tonex Co., Ltd.).

A single tackifying resin (B) may be used or two or more can be used in combination.

The amount of the tackifying resin (B) included in the mask adhesive is 20 to 150 parts by mass with respect to 100 parts by mass of the thermoplastic elastomer (A).

When SEBS is used as the thermoplastic elastomer (A), it is necessary to add 200 to 300 parts by mass of the tackifying resin (B) with respect to 100 parts by mass of SEBS in order to set the tan δ peak temperature of the obtained mask adhesive in the range of −10° C. to 30° C. On the other hand, in the present invention, even if the amount of the tackifying resin (B) with respect to 100 parts by mass of the thermoplastic elastomer (A) is 150 parts by mass or less, the tan δ of the obtained mask adhesive can be set in the range of −10° C. to 30° C. Therefore, the mask adhesive of the present invention is not very sticky, and also, almost no paste residue of the mask adhesive layer is left on a mask when the pellicle is peeled from the mask.

If the amount of the tackifying resin (B) with respect to 100 parts by mass of the thermoplastic elastomer (A) is less than 20 parts by mass, it is difficult to set the tan δ peak temperature of the obtained mask adhesive at −10° C. or more. On the other hand, if the amount of the tackifying resin (B) is more than 150 parts by mass, the obtained mask adhesive is sticky, and a paste residue of the mask adhesive layer is left on the mask when the pellicle is peeled from the mask.

(Other Components)

The mask adhesive may further include other components other than the thermoplastic elastomer (A) and the tackifying resin (B) described above. Examples of other components can include a softener and a wax.

The softener is not particularly limited as long as it is a material that can provide flexibility to the thermoplastic elastomer (A). Specific examples of the softener can include polybutenes, hydrogenated polybutenes, unsaturated polybutenes, aliphatic hydrocarbons, and acrylic polymers.

The amount of the softener added is generally 20 to 300 parts by mass, and preferably 50 to 200 parts by mass, with respect to 100 parts by mass of the thermoplastic elastomer (A).

The wax is a component that can adjust the hardness of the obtained mask adhesive. Specific examples of the wax can include high elasticity materials, such as a polyethylene wax and a polypropylene wax. The amount of the wax added is generally 20 to 200 parts by mass, preferably 50 to 100 parts by mass, with respect to 100 parts by mass of the thermoplastic elastomer (A).

(Mask Adhesive)

The tan δ peak temperature of the mask adhesive is −10° C. to 30° C., preferably −5° C. to 30° C., and further preferably −1° C. to 15° C. Work such as the mounting of a pellicle on a mask, the light exposing, and/or the like, is performed under ambient temperature. Therefore, the mask adhesive of the present invention having the tan δ peak temperature in the above range can provide a mask adhesive layer that can effectively relax the strain energy of a pellicle frame by plastic deformation the mask adhesive layer, under an ordinary temperature condition.

The maximum value of the tan δ of the mask adhesive is preferably 1.3 to 5, further preferably 1.3 to 3. A mask adhesive layer having a high maximum value of the tan δ is easily plastic-deformed, and can relax the strain energy of a pellicle frame. However, if the maximum value of tan δ is too high, the mask adhesive layer is too easily deformed, and it tends to be difficult for the pressure-sensitive adhesive layer to maintain the shape thereof.

The storage modulus (G') of the mask adhesive at 25° C. is preferably $1 \times 10^3$ to $1 \times 10^7$ Pa, and further preferably $1 \times 10^4$ to $1 \times 10^6$ Pa.

A mask adhesive having a storage modulus (G') in the above range has good handling properties. In order to increase the storage modulus (G') of the mask adhesive, the content amount of the thermoplastic elastomer (A) should be increased. On the other hand, in order to decrease the storage modulus (G') of the mask adhesive, the content amount of the thermoplastic elastomer (A) should be decreased.

The loss modulus (G") of the mask adhesive at 25° C. is preferably $1 \times 10^3$ to $1 \times 10^7$ Pa, and further preferably $1 \times 10^4$ to $1 \times 10^6$ Pa.

The tan δ, the storage modulus (G'), and the loss modulus (G") of the mask adhesive can be measured as described above.

The mask adhesive of the present invention has a tan δ peak temperature in the predetermined temperature range. Therefore, when the mask adhesive is applied to provide the mask adhesive layer of a pellicle, the mask adhesive layer can be plastic-deformed in an exposure temperature range so as to absorb (relax) the distortion of the pellicle and to prevent the distortion of the pellicle from transferring to the mask. Further, a paste residue of the mask adhesive layer of the present invention is less likely to be left. Therefore, even when a worker's hand comes into contact with the mask adhesive, the mask adhesive is easily removed from his/her hand, and therefore also superior in its handling properties.

In addition, the mask adhesive of the present invention has a peel strength from a quartz glass substrate of 50 to 300 gf (0.49 to 2.94 N) at 23° C., and a stress remaining rate R(900), defined by the following formula (1), in the range of $0 \leq R(900) \leq 15\%$.

$$\text{stress remaining rate } R(900) = \{F(900)/F(0)\} \times 100 \quad (1)$$

In the above formula (1), F(0) represents maximum stress measured by stress relaxation measurement, and F(900) represents stress measured by the stress relaxation measurement after 900 seconds in test time have lapsed. This stress relaxation measurement is executed under the condition of 23° C. with a rheometer.

Stress relaxation refers to a phenomenon in which stress acting in a material decreases due to plastic deformation of the material. The extent of stress relaxation (the rate at which stress relaxes) varies according to the material. However, stress relaxation can be quantified by a stress remaining rate R(t). The stress remaining rate R(t) is represented as the ratio (%) of stress F(t) after a test time of t seconds has lapsed with respect to maximum stress F(0). F(0) and F(t) can be measured by stress relaxation measurement with a rheometer (viscoelasticity measuring apparatus).

In order to compare the stress relaxation properties of different materials, the magnitudes of stress remaining rates should be compared. Generally, it is not easy for a material having a large stress remaining rate to eliminate a stress of the material even if the time has lapsed. On the other hand, it is easy for a material having a small stress remaining rate to eliminate a stress of the material with a lapse of time. And also, in order to compare the stress relaxation properties of two materials, it is necessary to compare stress remaining rates R(t) of the materials after the same test elapsed time (t seconds).

In a general semiconductor manufacturing process, after a pellicle is pressure-bonded to a mask, a mask adhesive undergoes stress relaxation to reduce residual stress of the pellicle. Thereby the distortion of the mask is eliminated. And then the process goes to the next step. Therefore, in terms of improving manufacturing efficiency, the time during for which residual stress is reduced is preferably short. In the present invention, the time required for the current general mask handling step is considered, as a result, a stress remaining rate R(900 s) at t=900 seconds is used as an indicator. In addition, since the general semiconductor manufacturing process is executed at room temperature (about 23° C.), a stress remaining rate measured at 23° C. is used as an indicator.

The mask adhesive of the present invention has a stress remaining rate R(900) in the range of 0 R(900) 20%, and further preferably $0 \leq R(900) \leq 15\%$. Therefore, when the mask adhesive is applied to provide the mask adhesive layer of a pellicle, the mask adhesive layer can be plastic-deformed in an exposure temperature range so as to absorb (relax) the distortion of the pellicle and to prevent the distortion of the pellicle from transferring to a mask.

The stress remaining rate R(900) of the mask adhesive can be measured and calculated using a dynamic viscoelasticity measuring apparatus (the trade name "ARES," manufactured by TA Instruments). Specifically, a disk-shaped sample piece (diameter: 25 mm×thickness: 2 mm) is sandwiched between two parallel plates (diameter: 25 mm) which are measurement jigs to obtain a test piece. The thickness of the test piece is adjusted to a predetermined initial gap width. And then stress F(t) at measurement time t is measured under the conditions of a nitrogen atmosphere, a shear mode, distortion: 1%, measurement temperature of 23° C., and initial Gap of 2 mm. Then, the stress remaining rate R(900) can be calculated from the obtained "maximum stress F(O)" and "stress F(900)" after 900 seconds in test time has lapsed.

In addition, the peel strength of the mask adhesive from a quartz glass substrate is 50 to 300 gf at 23° C., and preferably 100 to 250 gf. The peel strength from a quartz glass substrate can be an indicator of the presence or absence of a paste residue on a mask when a pellicle is peeled from the mask. The mask adhesive of the present invention has a peel strength from a quartz glass substrate at 23° C. within the above range, and therefore is less likely to leave a paste residue on the mask. In addition, even when a worker's hand comes into contact with the mask adhesive, the mask adhesive is easily removed from his/her hand, and therefore also superior in its handling properties. If the peel strength is less than 50 gf, the adhesion reliability decreases, for example, the pellicle comes off during use, and sticking position of the pellicle to the mask can be displaced. On the other hand, if the peel strength is more than 300 gf, a paste residue on the mask is left after peeling.

The peel strength of the mask adhesive can be measured according to a method shown below. First, (1) a cleaned quartz glass substrate (the model "#6025 substrate," manufactured by HOYA, size: 152 mm×152 mm×6.35 mm) is prepared. (2) A mask adhesive with a release liner removed is placed on the quartz glass substrate, and an aluminum pellicle frame (outer size: 149 mm×122 mm, frame height H, 5.8 mm, frame width W: 2 mm) is further placed. The mask adhesive size is outer size: 149 mm×122 mm and frame width W: 1.6 mm. (3) A 30 kg weight is placed on the pellicle frame for 3 minutes, and then the weight is removed to obtain a laminate composed of the quartz glass substrate, the mask adhesive and the pellicle frame. (4) The obtained laminate is set in a glass substrate holder, and stored for 10 days at 23° C. to stabilize adhesion in order to provide a measurement sample.

Figure 2:
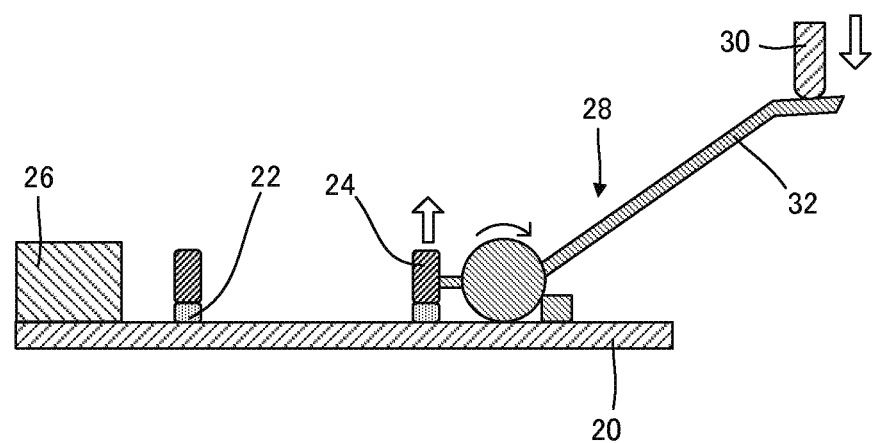
FIG. 2 is a cross-sectional view schematically showing a method for measuring the peel strength of a mask adhesive.

FIG. 2 is a cross-sectional view schematically showing a method for measuring the peel strength of a mask adhesive. As shown in FIG. 2, a laminate composed of quartz glass substrate 20, mask adhesive 22 (mask adhesive layer) and pellicle frame 24 is set, for example, on peeling jig 28 of a standard universal tester (manufactured by INTESCO co., Ltd.) so that the protrusion of peeling jig 28 is fitted into the jig hole (not shown) of pellicle frame 24. Weight 26 is placed on quartz glass substrate 20. A load cell for load measurement in the standard universal tester is adjusted to set measurement rate at 20 mm/min. And also, an end of arm 32 of peeling jig 28 is pushed down by push-down jig 30 under the condition of 23° C. The load required for mask adhesive 22 to peel from quartz glass substrate 20 can be measured as "peel strength (gf)."

2. Pellicle

The pellicle of the present invention includes a pellicle frame, a pellicle membrane disposed on one end surface of the pellicle frame, and a mask adhesive layer including a mask adhesive, disposed on the other end surface of the pellicle frame. FIG. 1 is a schematic view showing one embodiment of the pellicle of the present invention. Pellicle 10 in this embodiment has pellicle membrane 12, and pellicle frame 14 that supports the outer periphery of pellicle membrane 12. Pellicle membrane 12 is stretched across one end surface of pellicle frame 14 via film adhesive layer 13. On the other hand, in order to make pellicle frame 14 adhere to a mask (not shown), mask adhesive layer 15 is provided on the other end surface of pellicle frame 14. Mask adhesive layer 15 is made of the above-described mask adhesive.

Pellicle film 12 is held by pellicle frame 14, and covers the exposure area of the mask. Therefore, pellicle membrane 12 has such light transmission properties that the energy of exposure light is not absorbed. Examples of the material of pellicle membrane 12 include materials having transparency, such as quartz glass, fluorine resins, and cellulose acetate.

Pellicle frame 14 is an anodized aluminum frame or the like. Pellicle frame 14 is preferably black because the reflection of exposure light is prevented, and the presence or absence of attached foreign particles or the like is easily inspected.

Film adhesive layer 13 allows pellicle frame 14 to adhere pellicle membrane 12. Examples of film adhesive layer include acrylic resin adhesives, epoxy resin adhesives, silicone resin adhesives, and fluorine polymers such as fluorine-containing silicone adhesives.

Mask adhesive layer 15 allows pellicle frame 14 adhere to the mask. Mask adhesive layer 15 can be formed by applying and drying the above-described mask adhesive. The method for applying the mask adhesive may be a well-known method. For example, the mask adhesive can be applied to the desired place by a method of pressing a spatula-shaped application nozzle against an end surface of the pellicle frame, and discharging the mask adhesive from the application nozzle. The thickness of mask adhesive layer 15 is about 0.3 to 1.0 mm.

A release sheet (separator) for protecting mask adhesive layer 15 may be disposed on the surface of mask adhesive layer 15. Examples of the release sheet include polyethylene terephthalate films and polypropylene films. The release sheet is peeled before the pellicle is mounted on the mask.

Pellicle 10 is mounted on the mask via mask adhesive layer 15 after the release sheet is peeled. A foreign particle attached to the mask causes deterioration in resolution of a wafer. Therefore, pellicle 10 is mounted so as to cover the exposure area of the mask. Thus, foreign particles are prevented from attaching to the mask.

In order to mount pellicle 10 on the mask, a pellicle mounter (for example, manufactured by MATSUSHITA SEIKI CO. LTD.) is used. The pellicle and the mask are placed on the pellicle mounter under ambient temperature, and the pellicle is pressure-bonded to the mask. Pressure bonding may be performed for about 3 minutes at room temperature and at a pressure of about 20 kgf/cm$^2$, and also the conditions thereof may also depend on the type of the mask, and the like.

Specific examples of the mask can include a glass substrate such as a synthetic quartz or a quartz glass, on which a patterned light-shielding film is disposed. The light-shielding film is a film having a single-layer structure or a multilayer structure of metal, such as Cr or MoSi. The thickness of the mask is, for example, about 6 mm.

An exposure light used in lithography for forming a circuit pattern drawn on a semiconductor device has a shorter wavelength, such as i-line (wavelength of 365 nm) of a mercury lamp, the light of KrF excimer laser (wavelength of 248 nm), or the light of ArF excimer laser (wavelength of 193 nm).

As described above, the pellicle of the present invention has a mask adhesive layer that is moderately plastic-deformed in an exposure temperature range, and that is less likely to leave a paste residue on the mask. Therefore, when the pellicle is mounted on a mask, the mask adhesive layer can absorb and relax the strain energy of the pellicle, and can prevent the strain energy from transferring to the mask. Accordingly, a decrease in patterning precision due to the distortion of the mask can be prevented. In addition, when the pellicle is peeled from the mask, the mask adhesive layer does not leave a paste residue, and therefore the pellicle also has excellent handling properties.

Further, in double patterning, two exposures are performed on one wafer using two masks. As a result, two circuit patterns are combined in a staggered manner, producing a circuit pattern having a pitch that is half the pitch of a circuit pattern obtained with one mask. The pitch of the circuit pattern obtained by double patterning is about 1 to 5 nm.

Double patterning enables formation of a fine circuit pattern required in the state-of-the-art sub-32 nm node, the fine circuit pattern is difficult to be obtained by one exposure. In this technique, it is important to accurately combine respective circuit patterns formed by the first exposure and second exposure to meet a designed circuit pattern. Thus, the amount of pattern displacement between the respective two circuit patterns and the designed circuit pattern should be reduced as much as possible, the two circuit patterns being required for double patterning. The amount of the pattern displacement acceptable for the sub-32 nm node is about 0 to 5 nm, and preferably about 0 to 3 nm.

The amount of the pattern displacement is the difference in distance between the designed circuit pattern and the combined pattern of the two patterns composed of a pattern formed by the first exposure/development and a pattern formed by the second exposure/development.

The amount of the pattern displacement can be measured by the following method. First, the first exposure is performed via a mask. And then, the mask is displaced by a predetermined amount from the position at which the first exposure has been performed. And further, the second exposure is performed. At this time, the distance between a pattern formed by the first exposure/development and a pattern formed by the second exposure/development is measured by SEM observation. And then, a difference between the measured distance and a distance required from a designed circuit pattern is taken as the amount of the pattern displacement.

It is required for double patterning to make the pattern displacement decrease as much as possible, to the nm level, and to provide a high patterning precision. The pellicle of the present invention is particularly preferred for double patterning because the distortion of the pellicle is not transferred to the mask.

EXAMPLES

The present invention will now be specifically described with reference to Examples, which however shall not be construed as limiting the scope of the present invention. Methods for measuring various physical property values, and methods for evaluating properties are given below.

(1) Methods for Measuring Various Physical Property Values, and Various Evaluation Methods [tan δ Peak Temperature, Maximum Value of tan δ, Storage Modulus (G'), and Loss Modulus (G")]

Using a dynamic viscoelasticity measuring apparatus (the trade name "ARES," manufactured by TA Instruments), a disk-shaped sample piece (diameter: 25 mm×thickness: 2 mm) was sandwiched between two parallel plates (diameter: 25 mm) which were measurement jigs to obtain a test piece. The thickness of the test piece was adjusted to a predetermined initial gap width. And then the storage modulus (G') and the loss modulus (G") were measured under the conditions of a nitrogen atmosphere, a shear mode, frequency of 1 Hz, measurement temperature of −80° C. to 200° C., temperature increase rate of 3° C./min, and initial Gap of 2 mm. The tan δ (=G"/G') was obtained from the obtained storage modulus (G') and loss modulus (G"), and the temperature at the maximum value of the tan δ (tan δ peak temperature) and the maximum value thereof were calculated.

[Stress Remaining Rate R(900)]

Using a dynamic viscoelasticity measuring apparatus (the trade name "ARES," manufactured by TA Instruments), a disk-shaped sample piece (diameter: 25 mm×thickness: 2 mm) was sandwiched between two parallel plates (diameter: 25 mm) which were measurement jigs to obtain a test piece. The thickness of the test piece was adjusted to a predetermined initial gap width. And then, stress F(t) at measurement time t was measured under the conditions of a nitrogen atmosphere, a shear mode, distortion: 1%, measurement temperature of 23° C., and initial Gap of 2 mm. The stress remaining rate R(900) was calculated from the obtained "maximum stress F(O)" and "stress F(900)" after 900 seconds in test time have lapsed.

[Peel Strength]

(1) A cleaned quartz glass substrate (the model "#6025 substrate," manufactured by HOYA, size: 152 mm×152 mm×6.35 mm) was prepared. (2) A mask adhesive with a release liner removed was placed on the quartz glass substrate, and an aluminum pellicle frame (outer size: 149 mm×122 mm, frame height H, 5.8 mm, frame width W: 2 mm) was further placed. The mask adhesive size was outer size: 149 mm×122 mm and frame width W: 1.6 mm. (3) A 30 kg weight was placed on the pellicle frame for 3 minutes, and then the weight was removed to obtain a laminate composed of the quartz glass substrate, the mask adhesive, and the pellicle frame. (4) The obtained laminate was set in a glass substrate holder, and stored for 10 days at 23° C. to stabilize adhesion in order to provide a measurement sample.

As shown in FIG. 2, a laminate composed of quartz glass substrate 20, mask adhesive 22 (mask adhesive layer), and pellicle frame 24 was set on peeling jig 28 of a standard universal tester (manufactured by INTESCO co., Ltd.) so that the protrusion of peeling jig 28 was fitted into the jig hole (not shown) of pellicle frame 24. Weight 26 was placed on quartz glass substrate 20. A load cell for load measurement in the standard universal tester is adjusted to set measurement rate at 20 mm/min, and an end of arm 32 of peeling jig 28 was pushed down by push-down jig 30 under the temperature of 23° C. The load required for mask adhesive 22 to peel from quartz glass substrate 20 was measured as "peel strength (gf)."

[Amount of Pattern Displacement]

Using a semiconductor exposure apparatus (the trade name "ArF immersion scanner NSR-S610C," manufactured by NIKON CORPORATION), a wafer (6025 substrate, thickness: 6.35 mm, length: 151.95 mm) was exposed twice via a mask on which a pellicle was mounted, so as to print a pattern on the wafer. More specifically, the first exposure was performed. And then the mask was displaced, and the second exposure was performed. And further, the distance between the pattern formed by the first exposure and the pattern formed by the second exposure was measured by an SEM observation. A difference (X−Y) was taken as "the amount of pattern displacement (nm)," the difference (X−Y) meaning a difference between the measured distance (X) between the two patterns and the displacement distance (Y) of the mask. A smaller amount of the pattern displacement is preferred. A case where the amount of pattern displacement was 5 nm or less was evaluated as "good," and a case where the amount of pattern displacement was more than 5 nm was evaluated as "poor."

[Amount of Distortion of Mask]

A pellicle and a mask were placed on a pellicle mounter (manufactured by MATSUSHITA SEIKI CO. LTD.), and the pellicle was pressure-bonded to the mask made of quartz glass (thickness: 6.35 mm) under the conditions of temperature: ambient temperature (25° C.), pressure: 20 kgf/cm$^2$, and pressure bonding time: 3 minutes. The amount of distortion of the mask on which the pellicle was mounted was measured using a flatness measuring and analyzing apparatus (the trade name "UltraFlat 200 Mask," manufactured by Corning Tropel). The measurement area was 146 mm$^2$.

Generally, a mask on which a pellicle is mounted reflects the distortion of the pellicle frame (aluminum frame) so as to be distorted in a bow shape. When the entire mask is subjected to measurement with a flatness measuring and analyzing apparatus, the distortion of the mask is shown as a contour map. And also, the difference between the maximum value and minimum value in the amount of distortion is provided. A difference ((1)−(2)) was taken as "the amount of distortion (nm) of the mask" caused by the mounting of the pellicle, the difference ((1)−(2)) meaning a difference between the amount (1) of distortion of the entire mask before pellicle mounting and the amount (2) of distortion of the entire mask after pellicle mounting. A smaller amount of distortion of the mask is preferred, and "0" (that is, no distortion) is most preferred.

[Paste Residue]

While a surface of a mask after a pellicle was peeled was illuminated using an illumination apparatus (manufactured by Sena and Vans, illuminance: 300,000 lux) so as to make a light reflect on the surface of the mask, the presence or absence of a paste residue on the surface of the mask was visually observed.

(2) Various Components

As the raw materials of mask adhesives, various components shown below were used. (Thermoplastic Elastomer (A))

H-SIS (1): a styrene-hydrogenated isoprene-styrene block copolymer (the trade name "HYBRAR 7125" (manufactured by KURARAY CO., LTD.), tan δ peak temperature: −5° C., styrene content: 20 mass %)

H-SIS (2): a styrene-hydrogenated isoprene-styrene block copolymer (the trade name "HYBRAR 7311" (manufactured by KURARAY CO., LTD.), tan δ peak temperature: −17° C., styrene content: 12 mass %)

SEBS: a styrene-ethylene butylene-styrene block copolymer (the trade name "Tuftec H1062" (manufactured by Asahi Kasei Chemicals Corporation) tan δ peak temperature: −48° C.)

A (meth)acrylate ester elastomer: (the trade name "LA polymer 2140e" (manufactured by KURARAY CO., LTD.), tan δ peak temperature: −20° C.)

An olefin elastomer (1): (the trade name "NOTIO PN3560" (manufactured by Mitsui Chemicals, Inc.), tan δ peak temperature: −20° C.)

An olefin elastomer (2): a random copolymer of 4-methyl-1-pentene and 1-hexene (4-methyl-1-pentene: 55 mol %, 1-hexene: 45 mol %, tan δ peak temperature: −2° C.)

(Tackifying Resin (B))

A hydride of an alicyclic petroleum resin: a C9 hydrogenated petroleum resin (the trade name "ARKON P-100" (manufactured by Arakawa Chemical Industries, Ltd.), softening point: 100±5° C., number average molecular weight (Mn): 610)

A rosin ester resin (the trade name "PINECRYSTAL KE-311" (manufactured by Arakawa Chemical Industries, Ltd.), softening point: 100±5° C.)

(Softener)

Polybutene (the trade name "Nissan Polybutene 30N" (manufactured by NOF CORPORATION))

A paraffin mineral oil (the trade name "NEOVAC MR-200" (manufactured by MORESCO))

An acrylic polymer (the trade name "ARUFON UP1080" (manufactured by TOAGOSEI CO., LTD.))

(Wax)

A polypropylene pyrolysis wax (the trade name "Hi-WAX NP055" (manufactured by Mitsui Chemicals, Inc.))

(3) Manufacture of Pellicle (Example 1)

100 Parts by mass of H-SIS (1), 100 parts by mass of a tackifying resin (B), and 200 parts by mass of a softener, which total 48 g, were mixed to obtain a raw material mixture. The obtained raw material mixture was charged into Laboplastomill (manufactured by Toyo Seiki Seisaku-sho, Ltd., internal volume: 60 mL), and then sealed. The mixture was kneaded at 200° C. and 100 rpm for 20 minutes to obtain a massive mask adhesive. About 10 g of the mask adhesive was charged into a heating tank (the temperature in the tank: 200° C.), and melted. On the other hand, anodic oxidation-treated aluminum pellicle frame 14 (outer size: 149 mm×122 mm, frame height H, 5.8 mm, frame width W: 2 mm) as shown in FIG. 1 was prepared. The melted mask adhesive was extruded from a needle tip communicating with the heating tank, and applied to one end surface of pellicle frame 14 to form mask adhesive layer 15. The thickness of formed mask adhesive layer 15 was 0.6 mm. And further, a separator was disposed on the surface of mask adhesive layer 15. Pellicle film 12 was stuck on the other end surface of pellicle frame 14 via film adhesive layer 13 to obtain pellicle 10, mask adhesive layer 15 being not formed on the other end surface.

The measurement results of the tan δ peak temperature, the tan δ maximum value, the storage modulus (G') at 25° C., the loss modulus (G") at 25° C., the stress remaining rate R(900), and the peel strength of the mask adhesive are shown in Table 1. And also, the measurement and evaluation results of the amount of pattern displacement, the measurement result of the amount of distortion of the mask, and the evaluation result of a paste residue are shown in Table 1.

Examples 2 to 11 and Comparative Examples 1 to 6

A pellicle was obtained as in the above-described Example 1 except that components were mixed with a formulation shown in Table 1 to obtain a mixture. The measurement results of the tan δ peak temperature, the tan δ maximum value, the storage modulus (G') at 25° C., the loss modulus (G") at 25° C., the stress remaining rate R(900), and the peel strength of the mask adhesive are shown in Table 1. In addition, the measurement and evaluation results of the amount of pattern displacement, the measurement result of the amount of distortion of the mask, and the evaluation result of a paste residue are shown in Table 1.

TABLE 1

| | Examples | | | | | | | |
|---|---|---|---|---|---|---|---|---|
| | 1 | 2 | 3 | 4 | 5 | 6 | 7 | 8 |
| Formulation (mass parts) | | | | | | | | |
| Thermoplastic elastomer(A) | | | | | | | | |
| H-SIS(1)*1 | 100 | 100 | 100 | 100 | | 100 | 100 | |
| H-SIS(2)*2 | | | | | 100 | | | |
| SEBS*3 | | | | | | | | |
| (Meth)acrylate elastomer*4 | | | | | | | | 100 |
| Olefin elastomer (1)*5 | | | | | | | | |
| Olefin elastomer (2)*6 | | | | | | | | |
| Tackifying resin (B) | | | | | | | | |
| Hydride of alicyclic petroleum resin | 100 | 100 | 100 | 150 | 150 | 20 | 100 | |
| Rosin ester resin | | | | | | | | 50 |
| Softener | | | | | | | | |
| Polybutene | 200 | 150 | 150 | 150 | 150 | 150 | | |
| Paraffin mineral oil | | | | | | | 60 | |
| Acrylic polymer | | | | | | | | 45 |
| Wax | | | 25 | | | | | |
| tan δ peak temperature (° C.) of mask adhesive | 1 | 7 | 7 | 15 | −9 | −4 | 10 | −8 |
| tan δ maximum value of mask adhesive | 2.7 | 2.5 | 1.5 | 1.4 | 1.8 | 1.3 | 3.0 | 1.7 |
| Storage modulus (G') at 25° C. | 3.3E+04 | 6.0E+04 | 1.4E+05 | 3.9E+05 | 3.7E+05 | 6.9E+05 | 5.8E+04 | 3.2E+05 |
| Loss modulus (G") at 25° C. | 3.3E+04 | 6.5E+04 | 1.4E+05 | 4.7E+05 | 4.5E+05 | 7.2E+05 | 6.7E+04 | 4.2E+05 |
| Stress remaining rate R(900) (%) of mask adhesive | 10 | 5 | 7 | 1 | 15 | 12 | 4 | 11 |
| Peel strength (gf) of mask adhesive from quartz glass substrate | 260 | 230 | 200 | 300 | 280 | 70 | 250 | 200 |

TABLE 1-continued

| Measurement and evaluation results | | | | | | | | |
|---|---|---|---|---|---|---|---|---|
| Amount of pattern position displacement (nm) | 2 | 2 | 2 | 2 | 2 | 2 | 2 | 2 |
| Evaluation of amount of pattern position displacement | Good | Good | Good | Good | Good | Good | Good | Good |
| Amount of distortion (nm) of mask (nm) | 49 | 50 | 51 | 50 | 49 | 52 | 50 | 50 |
| Paste residue | None | None | None | None | None | None | None | None |

| | Examples | | | Comparative Examples | | | | | |
|---|---|---|---|---|---|---|---|---|---|
| | 9 | 10 | 11 | 1 | 2 | 3 | 4 | 5 | 6 |
| Formulation (mass parts) Thermoplastic elastomer (A) | | | | | | | | | |
| H-SIS(1)*1 | | | | | | | | 100 | |
| H-SIS(2)*2 | | | | | | | | | 100 |
| SEBS*3 | | | | 100 | 100 | 100 | | 100 | |
| (Meth)acrylate elastomer*4 | 100 | | | | | | | | |
| Olefin elastomer (1)*5 | | 100 | | | | | | | |
| Olefin elastomer (2)*6 | | | 100 | | | | | | |
| Tackifying resin (B) | | | | | | | | | |
| Hydride of alicyclic petroleum resin | | 150 | 50 | 100 | 150 | 200 | 200 | 200 | 10 |
| Rosin ester resin | 30 | | | | | | | | |
| Softener | | | | | | | | | |
| Polybutene | | 100 | 100 | 150 | 150 | 150 | 150 | 150 | 150 |
| Paraffin mineral oil | | | | | | | | | |
| Acrylic polymer | | | | | | | | | |
| Wax | | | | | | | | | |
| tanδ peak temperature (° C.) of mask adhesive | 5 | −1 | 2 | −21 | −11 | 5 | 27 | 13 | −15 |
| tanδ maximum value of mask adhesive | 2.1 | 1.6 | 1.5 | 2.3 | 2.5 | 2.7 | 1.7 | 2.0 | 1.6 |
| Storage modulus (G') at 25° C. | 8.1E+05 | 6.7E+04 | 8.7E+04 | 3.2E+04 | 7.0E+04 | 8.0E+04 | 8.5E+04 | 2.1E+05 | 6.7E+06 |
| Loss modulus (G") at 25° C. | 9.9E+05 | 7.1E+04 | 9.3E+04 | 1.9E+04 | 2.0E+04 | 1.9E+05 | 1.4E+05 | 2.4E+05 | 1.6E+06 |
| Stress remaining rate R(900) (%) of mask adhesive | 7 | 12 | 9 | 38 | 19 | 6 | 1 | 3 | 27 |
| Peel strength (gf) of mask adhesive from quartz glass substrate | 180 | 300 | 270 | 240 | 300 | 500 | 450 | 410 | 50 |
| Measurement and evaluation results | | | | | | | | | |
| Amount of pattern position displacement (nm) | 2 | 2 | 2 | 10 | 9 | 2 | 2 | 2 | 9 |
| Evaluation of amount of pattern position displacement | Good | Good | Good | Poor | Poor | Good | Good | Good | Poor |
| Amount of distortion (nm) of mask (nm) | 48 | 49 | 51 | 121 | 116 | 51 | 48 | 59 | 117 |
| Paste residue | None | None | None | None | None | Present | Present | Present | None |

*1: tanδ peak temperature = −5° C., tanδ maximum value = 1.7
*2: tanδ peak temperature = −17° C., tanδ maximum value = 1.9
*3: tanδ peak temperature = −48° C., tanδ maximum value = 1.2
*4: tanδ peak temperature = −20° C., tanδ maximum value = 0.9
*5: tanδ peak temperature = −20° C., tanδ maximum value = 1.0
*6: tanδ peak temperature = −2° C., tanδ maximum value = 1.0

In examples 1 to 11, the amount of distortion of the mask was 52 nm or less, and also the amount of pattern displacement was 2 nm or less, which was an amount of position displacement small enough to perform double patterning. In addition, in all Examples, no paste residue was left when the pellicle was peeled from the mask. On the other hand, in Comparative Examples 1 to 6, the evaluation of any of the amount of pattern displacement, the amount of distortion of the mask, and a paste residue was poor.

The mask adhesives used in the pellicles of Comparative Examples 1 and 2 have the tan δ peak temperatures of the thermoplastic elastomer (A) outside the predetermined range. Therefore, even if the blended amount of the tackifying resin (B) was increased to 150 parts by mass with respect to 100 parts by mass of the thermoplastic elastomer (A), the tan δ peak temperatures of the obtained mask adhesives were lower temperatures (−21° C. and −11° C.) than −10° C. Therefore, it is presumed that the amount of pattern displacement and the amount of distortion of the mask increased. However, it is considered that since the blended amount of the tackifying resin (B) was not excessive, no paste residue was left.

In the mask adhesive used in the pellicle of Comparative Example 3, the blended amount of the tackifying resin (B) was increased to 200 parts by mass with respect to 100 parts by mass of the thermoplastic elastomer (A). Therefore, the tan δ peak temperature of the obtained mask adhesive was in the range of −10° C. to 30° C. Therefore, it is presumed that the amount of pattern displacement and the amount of distortion of the mask decreased. On the other hand, it is thought that a paste residue was left because the amount of the tackifying resin (B) blended was excessive.

The mask adhesives used in the pellicles of Comparative Examples 4 and 5 have the tan δ peak temperatures of the thermoplastic elastomer (A) in the predetermined range. Therefore, the tan δ peak temperature of the obtained mask adhesives was in the range of −10° C. to 30° C. It is presumed that the amount of pattern displacement and the amount of distortion of the mask decreased. On the other hand, it is thought that a paste residue was left because the amount of the tackifying resin (B) blended was excessive.

The mask adhesive used in the pellicle of Comparative Example 6 has the tan δ peak temperature of the thermoplastic elastomer (A) in the predetermined range. However, since the blended amount of the tackifying resin (B) was too small with respect to 100 parts by mass of the thermoplastic elastomer (A), the tan δ peak temperature of the obtained mask adhesive was a lower temperature (−15° C.) than −10° C. Therefore, it is presumed that the amount of pattern displacement and the amount of distortion of the mask increased. However, it is thought that no paste residue was left because the amount of the tackifying resin (B) blended was not excessive.

INDUSTRIAL APPLICABILITY

The pellicle of the present invention is preferred for patterning in which high patterning precision is required, which includes double patterning.

REFERENCE SIGNS LIST

10 pellicle
12 pellicle membrane
13 film adhesive layer
14, 24 pellicle frame
15 mask adhesive layer
20 quartz glass substrate
22 mask adhesive
26 weight
28 peeling jig
30 push-down jig
32 arm

The invention claimed is:

1. A pellicle comprising:
a pellicle frame;
a pellicle membrane disposed on one end surface of the pellicle frame; and
a mask adhesive layer including a mask adhesive, the mask adhesive layer being disposed on the other end surface of the pellicle frame, wherein
the mask adhesive includes 100 parts by mass of a thermoplastic elastomer (A) having a temperature of −20° C. to 30° C. at which a maximum value of a loss tangent is measured under a frequency of 1 Hz, and 20 to 150 parts by mass of a tackifying resin (B),
the thermoplastic elastomer (A) is at least one selected from the group consisting of a styrene thermoplastic elastomer, a (meth)acrylate ester thermoplastic elastomer, and an olefin thermoplastic elastomer, and
the mask adhesive has a temperature of −10° C. to 30° C. at which the maximum value of loss tangent is measured under a frequency of 1 Hz.

2. The pellicle according to claim 1, wherein the thermoplastic elastomer (A) is a styrene thermoplastic elastomer.

3. The pellicle according to claim 2, wherein the styrene thermoplastic elastomer is a triblock copolymer having a first polystyrene block, a polyisoprene block having an isopropenyl group in a side chain, and a second polystyrene block, and/or a hydrogenation product thereof.

4. The pellicle according to claim 1, wherein a softening point of the tackifying resin (B) is 60° C. to 150° C.

5. The pellicle according to claim 1, wherein a number average molecular weight of the tackifying resin (B) is 300 to 3,000.

6. The pellicle according to claim 1, wherein the tackifying resin (B) is at least one selected from the group consisting of a rosin and a derivative thereof, a polyterpene resin and a hydride thereof, a terpene phenol resin and a hydride thereof, an aromatic modified terpene resin and a hydride thereof, a coumarone-indene resin, an aliphatic petroleum resin, an alicyclic petroleum resin and a hydride thereof, an aromatic petroleum resin and a hydride thereof, an aliphatic-aromatic copolymer petroleum resin, and a dicyclopentadiene petroleum resin and a hydride thereof.

7. A pellicle comprising:
a pellicle frame;
a pellicle membrane disposed on one end surface of the pellicle frame; and
a mask adhesive layer including a mask adhesive, the mask adhesive layer being disposed on the other end surface of the pellicle frame, wherein
a peel strength of the mask adhesive from a quartz glass substrate is 50 to 300 gf at 23° C., and
a stress remaining rate R(900) of the mask adhesive defined by the following formula (1) is in the range of 0 ≤ R(900)≤15%, $$\text{stress remaining rate } R(900) = \{F(900)/F(0)\} \times 100 \quad (1)$$

where F(0) represents maximum stress measured by stress relaxation measurement, F(900) represents stress measured by the stress relaxation measurement after 900 seconds in test time have lapsed; and the stress relaxation measurement is executed under a condition of 23° C. with a rheometer.

8. A mask adhesive comprising 100 parts by mass of a thermoplastic elastomer (A) having a temperature of −20° C. to 30° C. at which a maximum loss tangent is measured under a frequency of 1 Hz, and 20 to 150 parts by mass of a tackifying resin (B), wherein
the thermoplastic elastomer (A) is at least one selected from the group consisting of a styrene thermoplastic elastomer, a (meth)acrylate ester thermoplastic elastomer, and an olefin thermoplastic elastomer, and
the mask adhesive having a temperature of −10° C. to 30° C. at which the maximum loss tangent is measured under a frequency of 1 Hz.

9. A mask adhesive having a peel strength from a quartz glass substrate of 50 to 300 gf at 23° C., and
a stress remaining rate R(900), defined by the following formula (1), in the range of 0≤R(900)≤15%, $$\text{stress remaining rate } R(900) = \{F(900)/F(0)\} \times 100 \quad (1)$$

where F(0) represents maximum stress measured by stress relaxation measurement, F(900) represents stress measured by the stress relaxation measurement after 900 seconds in test time have lapsed; and the stress relaxation measurement is executed under a condition of 23° C. with a rheometer.

* * * * *